United States Patent [19]
Feyh et al.

[11] Patent Number: 6,157,604
[45] Date of Patent: Dec. 5, 2000

[54] SAMPLED AMPLITUDE READ CHANNEL EMPLOYING A BAUD RATE ESTIMATOR FOR DIGITAL TIMING RECOVERY IN AN OPTICAL DISK STORAGE DEVICE

[75] Inventors: German S. Feyh, Boulder; Jim Graba, Longmont; William G. Bliss, Thornton, all of Colo.

[73] Assignee: Cirrus Logic, Inc., Austin, Tex.

[21] Appl. No.: 09/080,559

[22] Filed: May 18, 1998

[51] Int. Cl.[7] .................................................... H04N 5/76
[52] U.S. Cl. ........................................ 369/59; 369/124.01
[58] Field of Search ................................. 360/51, 46, 65; 375/341; 369/59, 124, 47, 48

[56] References Cited

U.S. PATENT DOCUMENTS

| | | |
|---|---|---|
| 5,432,766 | 7/1995 | Ando et al. . |
| 5,521,895 | 5/1996 | Miura et al. . |
| 5,621,710 | 4/1997 | Koo . |
| 5,694,380 | 12/1997 | Shimizume et al. . |
| 5,696,639 | 12/1997 | Spurbeck et al. . |
| 5,699,335 | 12/1997 | Joo et al. . |
| 5,701,284 | 12/1997 | Lee . |
| 5,706,265 | 1/1998 | Bang . |
| 5,781,590 | 7/1998 | Shiokawa et al. . |
| 5,790,482 | 8/1998 | Saga et al. . |
| 5,835,295 | 11/1998 | Behrens ........................................ 360/51 |
| 5,850,377 | 12/1998 | Taguchi et al. ............................ 369/48 |
| 5,872,754 | 2/1999 | Taguchi et al. ............................ 369/50 |
| 5,892,632 | 4/1999 | Behrens et al. ............................ 360/51 |
| 5,903,857 | 5/1999 | Behrens et al. ............................ 360/51 |
| 6,009,549 | 12/1999 | Bliss et al. .................................. 360/51 |
| 6,023,386 | 2/2000 | Reed et al. .................................. 360/51 |

OTHER PUBLICATIONS

Eduard F. Stikvoort and Jeannet A.C. v. Rens, "An All–Digital Bit Detector for Compact Disc Players", *IEEE Journal on Selected Areas in Communications*, vol. 10, No. 1, Jan. 1992.

*Primary Examiner*—Nabil Hindi
*Attorney, Agent, or Firm*—Howard H. Sheerin; Dan Shifrin

[57] ABSTRACT

A sampled amplitude read channel for optical disk storage systems is disclosed comprising an all digital timing recovery circuit. The RF read signal from the read head is sampled asynchronous to the baud rate and the asynchronous sample values are interpolated to generate sample values that are substantially synchronous to the baud rate. A data detector, such as a Viterbi sequence detector, processes the synchronous sample values to generate an estimated binary sequence representing the recorded binary sequence. The timing recovery circuit comprises a baud rate estimator for estimating the baud rate relative to the sampling rate, wherein the estimated baud rate is used to initialize a timing recovery loop filter at the end of seek operations. The all digital timing recovery circuit and baud rate estimator enable the storage device to begin reading the user data immediately after a seek operation, rather than wait for the CLV servo loop to acquire the target spindle speed.

27 Claims, 6 Drawing Sheets

SAMPLED AMPLITUDE READ CHANNEL EMPLOYING A BAUD RATE ESTIMATOR FOR DIGITAL TIMING RECOVERY IN AN OPTICAL DISK STORAGE DEVICE

CROSS REFERENCE TO RELATED APPLICATIONS AND PATENTS

This patent is related to co-pending U.S. patent application Ser. No. 08/751,880 entitled "ZERO PHASE RESTART FOR INTERPOLATED TIMING RECOVERY IN A SAMPLED AMPLITUDE READ CHANNEL" which is hereby incorporated by reference.

FIELD OF INVENTION

The present invention relates to optical disk storage systems, particularly to a sampled amplitude read channel employing a baud rate estimator for estimating a baud rate (or equivalently an oversampling rate) used to initialize a digital timing recovery circuit.

BACKGROUND OF THE INVENTION

The market is inundated with optical disk storage devices. They are used to store audio information, such as in Compact Disk (CD) players, as well as audio, visual, and computer information, such as in CD-ROM and the more recent Digital Video Disk (DVD) players. The information is typically recorded as a binary sequence by writing a series of "pits" on the optical medium which represent binary "1" and "0" bits. During a read operation, the disk is irradiated by a laser beam emanating from a read head (transducer) positioned over the disk. The pits alter a characteristic of the laser beam (e.g., the phase) such that the reflected beam is modulated by the originally recorded data sequence. The reflected beam is converted into an analog read signal, referred to as an RF read signal due to its high frequency, which is then demodulated by read channel circuitry to reproduce the recorded data.

The mechanics of the read head include a laser diode for generating the laser beam, an objective lens for focusing the laser beam onto the disk, and optics for detecting the laser beam reflecting off the disk. This bulky configuration makes optical disk storage devices less useful as random access devices because of the slow access time in positioning the read head over a particular part of the disk. The entire sled assembly 2 containing the read head is positioned radially over the disk 4 by means of a lead screw 6 as shown in FIG. 1. The frequency response of this servo system is much slower as compared to magnetic disk storage devices. Consequently, optical disk storage systems are better suited for storing large blocks of contiguous information, such as long streams of audio or visual data, where the number of random access seeks to different locations on the disk is minimized.

Because of the contiguous character of the data, it is typically recorded in data tracks that spiral inward from the outer diameter to the inner diameter of the disk 4 as shown in FIG. 1. This format maximizes the data capacity by allowing for a constant recording density (linear data density) from the outer to inner diameter of the disk 4. However, because it is desirable to maintain a constant data rate consistent with the rate of the audio or visual data stream, the rotation speed of the disk is varied to maintain a constant linear velocity (CLV) as the read head traverses radially over the disk. Thus, an optical disk storage device typically comprises a variable speed spindle motor 8 as shown in FIG. 1 which is adjusted by a CLV servo loop 10 to maintain a constant data rate relative to the position of the read head 2. The recorded data typically includes special fields referred to as servo address marks (SAM) recorded at a predetermined interval within the data tracks. The SAM fields are detected by a read channel 12 and communicated to the servo controller 10. The frequency of the detected SAM fields is proportional to the linear velocity of the disk at the radial position of the read head; the speed of the spindle motor 8 is controlled to maintain a constant SAM frequency and thus a constant linear velocity.

Although random access seeks to different radial locations over the disk are less frequent due to the contiguous character of the data, they are still necessary. For example, it may be necessary to interrupt accessing an audio or visual stream to access related computer data located on a different track at a different radial location of the disk. In such instances, it is necessary to adjust the spindle speed to account for the corresponding change in the data rate. This is normally accomplished by making a course adjustment to the spindle motor during the seek operation as the read head traverses radially over the disk toward the target track, and then by making a fine adjustment based on the frequency of the detected SAM fields when the read head reaches the target track (or a track nearby). A drawback associated with the way timing recovery is implemented in prior art optical storage systems prevents any data from being read at the end of the seek operation until the CLV servo loop acquires the correct spindle speed. This added latency increases the overall access time of the storage system.

The function of timing recovery in an optical storage system is to determine the instantaneous baud rate of the data in the analog read signal so that the data can be accurately extracted. For instance, in the prior art optical storage device shown in FIG. 2, a timing recovery circuit 14 processes the RF read signal 16 to generate a data clock 18 synchronous with the baud rate. The data clock 18 is applied to an RF demodulator 20 which detects whether zero crossings in the RF read signal 16 occur during each data clock period. The presence of a zero crossing during a data clock period is detected as a binary "1" bit, and the absence of a zero crossing during a data clock period is detected as a binary "0" bit. The timing recovery circuit 14 adjusts the data clock 18 so that the detected zero crossings occur at the center of the data clock periods on average. Because adjustments to the timing recovery PLL are made only when zero crossings are detected, the recorded data stream is encoded so as to limit the maximum number of consecutive "0" bits. The recorded data stream is also encoded to ensure a minimum spacing between consecutive zero crossings which reduces the undesirable affect of intersymbol interference (ISI). The channel code which implements these run-length constraints is referred to as an eight-to-fourteen or EFM code because it encodes eight input bits into fourteen output bits such that the recorded data stream comprises not less than two consecutive "0" bits and not more than ten consecutive "0" bits.

An implementation of the prior art timing recovery circuit 14 is shown in FIG. 3. This circuit implements a phase-lock-loop (PLL) using a variable frequency oscillator (VFO) 22. A frequency synthesizer 24 generates a center frequency control signal 26 which sets the center frequency of the VFO 22 at the optimal data rate. A frequency/phase error between the actual and optimal baud rate is computed and added to the center frequency control signal 26 at adder 28 in order to lock the output of the VFO 22 to the actual baud rate of the RF read signal 16. A phase error detector 30 computes a phase error 32 between the RF read signal 16 and the data clock 18 output by the VFO 22. The phase error 32 is then filtered by a loop filter 34, the output of which eventually settles to a frequency offset 36 between the baud rate of the RF read signal 16 and the data clock 18. The frequency offset 36, together with the center frequency control signal 26, adjust the output of the VFO 22 until the data clock 18 is locked onto the baud rate.

The reason the optical storage system must wait for the CLV servo loop to acquire the target linear velocity for the spindle motor at the end of a seek operation is because the PLL in the timing recovery circuit 14 of FIG. 3 has a relatively narrow acquisition range. In other words, the initial baud rate in the RF read signal 16 must be close enough to the optimal frequency or the timing recovery PLL will not be able to acquire the baud rate.

There is, therefore, a need for an improved timing recovery circuit for use with optical storage devices that is capable of acquiring the baud rate immediately following a seek operation without having to wait for the CLV servo loop to acquire the correct spindle speed. An enabling aspect of the present invention is to provide a simple circuit for estimating the instantaneous baud rate at the end of a seek operation in order to accurately initialize the timing recovery circuit prior to reading the recorded data.

SUMMARY OF THE INVENTION

A sampled amplitude read channel for optical disk storage systems is disclosed comprising an all digital timing recovery circuit. The RF read signal from the read head is sampled asynchronous to the baud rate and the asynchronous sample values are interpolated to generate sample values that are substantially synchronous to the baud rate. A data detector, such as a Viterbi sequence detector, processes the synchronous sample values to generate an estimated binary sequence representing the recorded binary sequence. The timing recovery circuit comprises a baud rate estimator for estimating the baud rate relative to the sampling rate, wherein the estimated baud rate is used to initialize a timing recovery loop filter at the end of seek operations. The all digital timing recovery circuit and baud rate estimator enable the storage device to begin reading the user data immediately after a seek operation, rather than wait for the CLV servo loop to acquire the target spindle speed.

BRIEF DESCRIPTION OF THE DRAWINGS

The above and other aspects and advantages of the present invention will be better understood by reading the following detailed description of the invention in conjunction with the drawings, wherein.

DETAILED DESCRIPTION OF THE PREFERRED EMBODIMENT

Sampled Amplitude Read Channel

Figure 4:
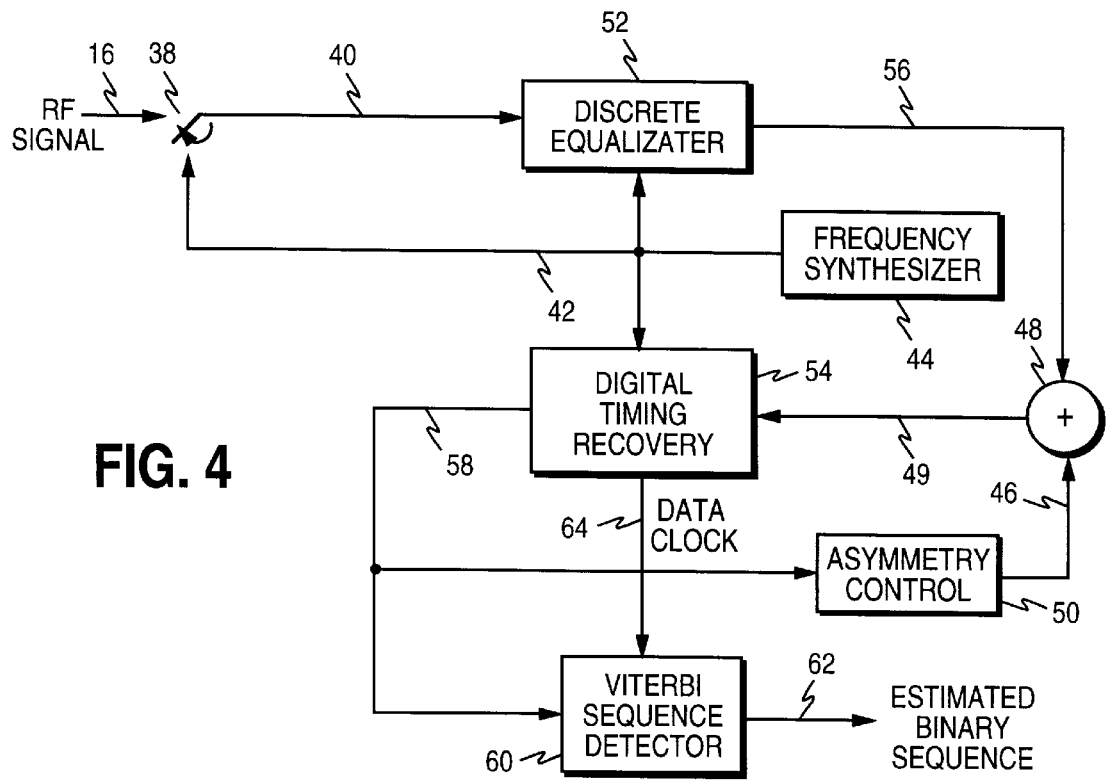
FIG. 4 is a block diagram of the sampled amplitude read channel of the present invention comprising an all digital timing recovery circuit.

A block diagram of the sampled amplitude read channel of the present invention is shown in FIG. 4. The RF read signal 16 received from the optical transducer is sampled by a sampling device 38 (e.g., an analog-to-digital converter) to generate a sequence of discrete time sample values 40. The sampling device 38 is clocked at a constant frequency by a sampling clock 42 generated by a frequency synthesizer 44. Consequently, the discrete time sample values 40 output by the sampling device 38 are asynchronous to the baud rate of the data in the RF read signal 16.

The asynchronous samples 40 are equalized (filtered) by a discrete time equalizer 52. The function of the discrete time equalizer 52 is to shape the spectrum of the RF read signal 16 (represented as the asynchronous sample values 50) according to a target spectrum. In the preferred embodiment, the target spectrum is a partial response (PR) spectrum. Those skilled in the art understand that with a partial response spectrum, the response of the recording channel to an isolated transition is non-zero for a predetermined number of baud synchronous samples, and zero at all other baud synchronous sampling instances. This allows for a controlled amount of inter-symbol interference (ISI) while still being able to transmit and accurately extract data at or near the Nyquist rate of 2W symbols per second (where W is the bandwidth of the channel).

To take advantage of partial response signaling, however, it is necessary to produce samples of the RF read signal synchronous to the baud rate. In the present invention, this is accomplished using a digital timing recovery circuit 54 which interpolates the asynchronous, equalized sample values 56 to generate interpolated sample values 58 substantially synchronized to the baud rate. The baud rate synchronous samples 58 are then processed by a Viterbi sequence detector 60 to detect an estimated binary sequence 62 representing the recorded binary sequence. The baud rate synchronous samples 58 are also processed by an asymmetry control circuit 50 which generates an asymmetry offset signal 46 added to the eqaulized sample values 56 at adder 48 in order to compensate for assymetry in the positive and negative pulses of the RF read signal caused by the varying reflective properties of the optical disk.

The operation and implementation of the Viterbi sequence detector 60 is well known; the specific details are not necessary to understand the aspects of the present invention. In general, though, the Viterbi sequence detector demodulates the RF read signal by evaluating the sample values in context. A series of sample values are evaluated using a trellis state machine which generates several candidate binary sequences that could have generated the sample value sequence of the RF read signal. The binary sequence with corresponding ideal sample values closest to the input sample values 58 is selected as the output 62 of the Viterbi sequence detector 60. The Viterbi detector 60 takes into account the effect of ISI inherent in partial response signaling by appropriately designing the trellis state machine.

In the preferred embodiment, the all digital timing recovery circuit 54 interpolates the asynchronous sample values 56 to generate interpolated sample values 58 substantially synchronous to the baud rate. The digital timing recovery circuit also generates a data clock 64 that is synchronized to the baud rate on average for clocking the Viterbi sequence detector 60 in order to process each new interpolated sample value 58. As described in the following section, the data clock 64 is generated by decimating the sampling clock 42 relative to the amount of oversampling and a current interpolation interval $\tau$.

Digital Timing Recovery

Figure 5:
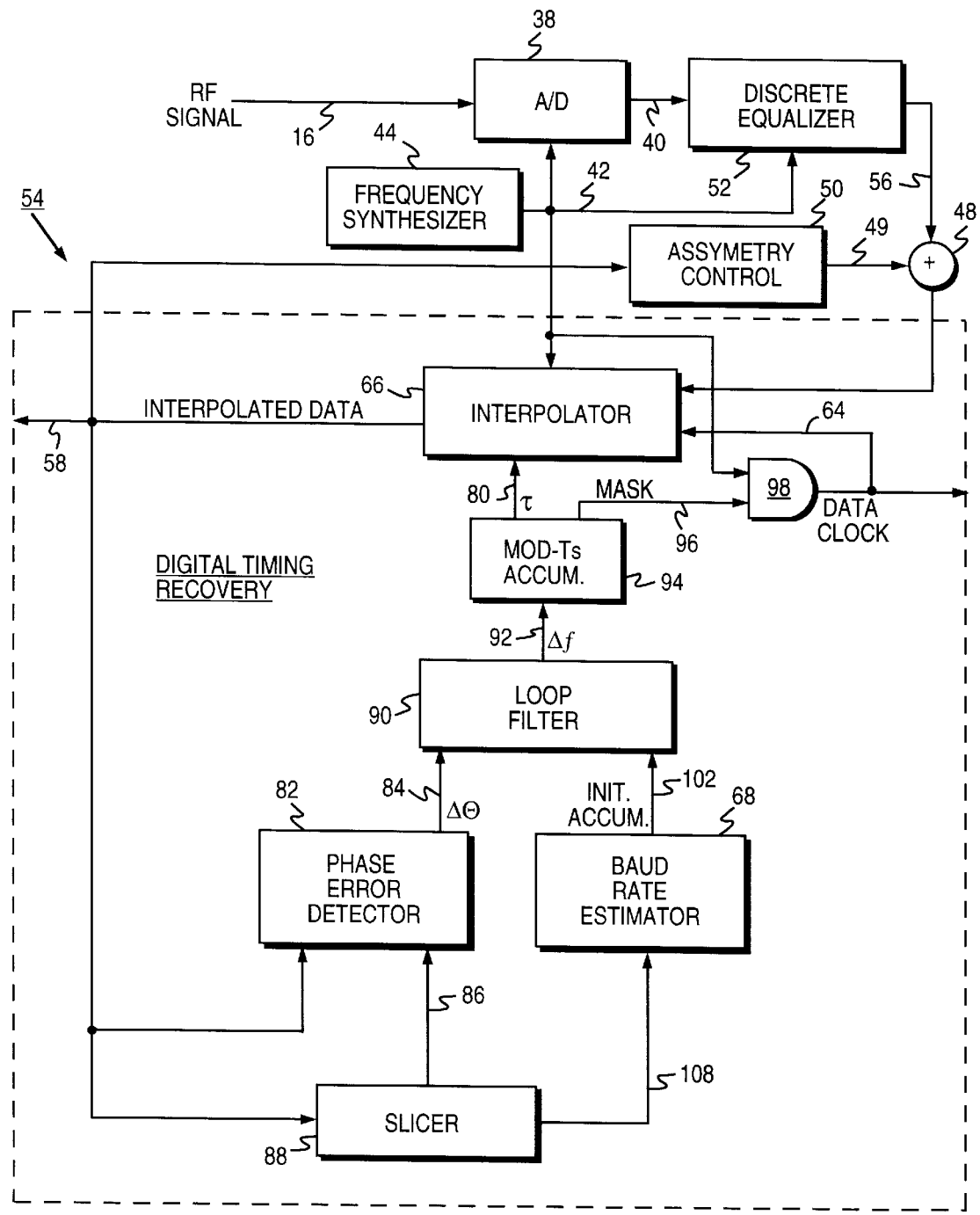
FIG. 5 shows details of the all digital timing recovery circuit of the present invention comprising an interpolator and a baud rate estimator.

Details of the all digital timing recovery circuit 54 of the present invention are shown in FIG. 5. The asynchronous sample values 56 output by the discrete time equalizer 52 are input into an interpolator 66. The interpolator 66 interpolates the asynchronous sample values 56 to generate interpolated sample values 58 substantially synchronized to the baud rate. Operation of the interpolator is understood with reference to FIG. 7.

Figure 7:
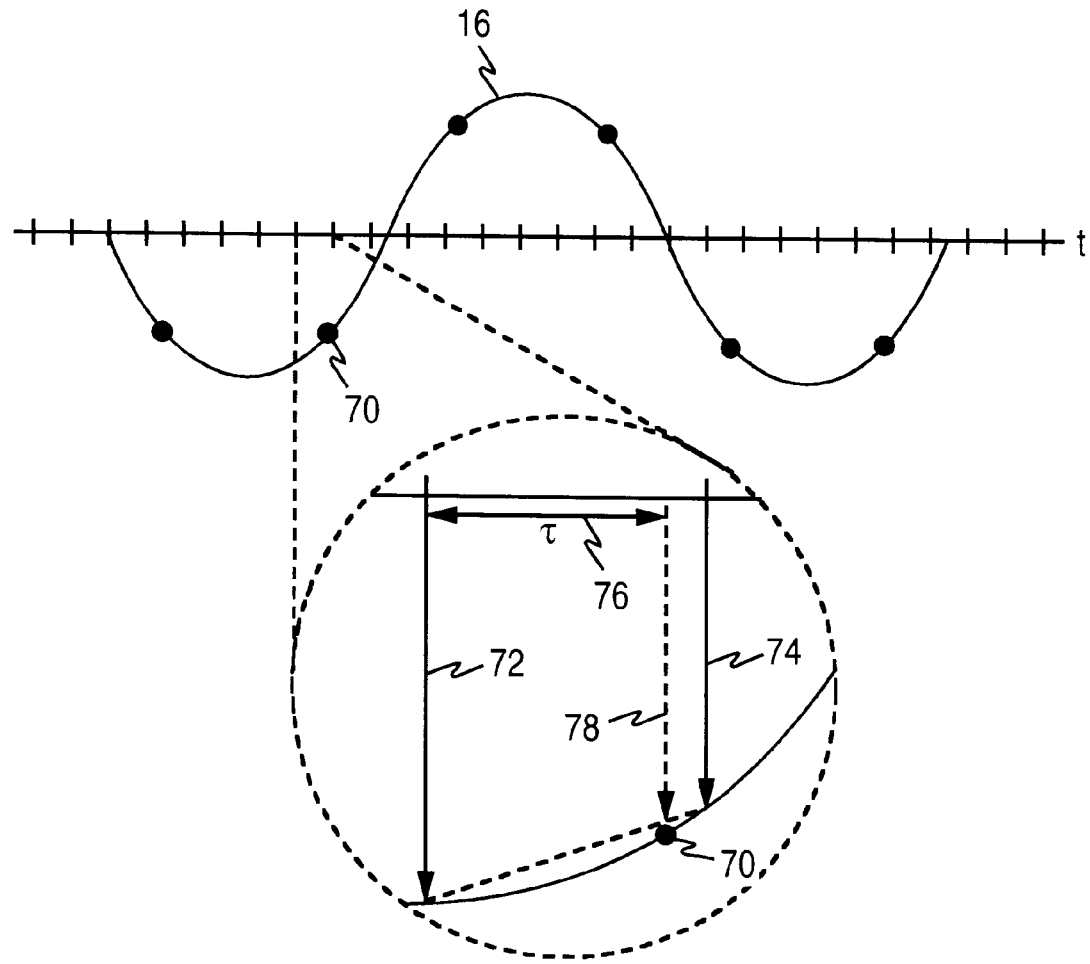
FIG. 7 illustrates the asynchronous sampling and interpolation aspects in the timing recovery circuit of the present invention.

FIG. 7 shows the RF read signal 16 sampled asynchronous to the baud rate samples which are shown as black circles on the waveform. Each index of the time axis represents a sample period of the sampling device 38. The RF read signal samples surrounding the baud rate sample 70 has been enlarged to illustrate the interpolation process. The signal samples 72 and 74 are shown as solid lines extending from the time axis to the waveform. In-between the signal samples 72 and 74 is the target baud rate sample value 70. An interpolation interval $\tau$ 76 is computed as the fraction of the sample period measured from the first signal sample 72 to the baud rate sample 70. The interpolator 66 of FIG. 5 uses the interpolation interval $\tau$ 76 to generate an interpolated sample value 78 that approximates the baud rate sample 70. In the preferred embodiment, the interpolator 66 implements a simple linear interpolation algorithm:

$$Y(N-1)=x(N-1)+\tau \cdot (x(N)-x(N-1))$$

where $x(N-1)$ and $x(N)$ are the channel samples 72 and 74 surrounding the target baud rate sample 70, $\tau$ is the interpolation interval 76, and $Y(N-1)$ is the interpolated sample value 78 that approximates the baud rate sample 70 as shown in FIG. 7.

The simple linear interpolation computation shown in FIG. 7 provides sufficient accuracy in approximating the baud rate samples as long as the oversampling rate is sufficiently large. In the preferred embodiment, the sampling frequency is selected to provide an oversampling rate on the order of 2 to 16 times the highest frequency in the RF read signal. The oversampling rate in FIG. 7 is approximately 4 times the baud rate and approximately 8 times the highest frequency in the RF read signal (i.e., the present invention encodes the recorded data such that the baud rate is approximately half the Nyquist rate). Consequently, the interpolated sample value 78 shown in FIG. 7 provides a very good approximation of the baud rate sample 70.

If the sampling rate is decreased to reduce the complexity and power consumption of the circuitry, or if the baud rate is increased to increase throughput and capacity, then a higher order interpolator is necessary to accurately estimate the baud rate samples. The ideal interpolator is a filter that has the following impulse response:

$$\mathrm{sinc}(\pi(n-\tau/T_s))$$

where $T_s$ is the sampling period. Unfortunately, the above non-causal infinite impulse response cannot be realized. Therefore, the impulse response of the interpolation filter is designed to be a best fit approximation of the ideal impulse response. This can be accomplished by minimizing a mean squared error between the frequency response of the actual interpolation filter and the frequency response of the ideal interpolation filter. For an example of how to implement such an interpolation filter, see the above referenced U.S. patent application entitled "ZERO PHASE RESTART FOR INTERPOLATED TIMING RECOVERY IN A SAMPLED AMPLITUDE READ CHANNEL."

From FIG. 7, it can be seen that the interpolation interval $\tau$ will vary for each new interpolated sample value generated; the rate $\tau$ changes is a function of the oversampling rate. Consider, for example, an oversampling rate of 3.1 times the baud rate. If the first baud rate sample occurs synchronous to the sample clock (i.e., $\tau$=0), then the $\tau$ computed for the next baud rate sample will be 0.1 (the fractional portion of 3.1), and the $\tau$ computed for the sample after that will be 0.2 (the fractional portion of 3.1+3.1=6.2). Eventually, $\tau$ will be greater than one wherein it will "wrap" back to 0 (the fractional portion of 3.1 added ten times or 31.0).

The circuitry in FIG. 5 for computing the interpolation interval $\tau$ 80 is similar to the circuitry in a conventional phase-locked-loop. A phase error detector 82 computes a phase error $\Delta\Theta$ 84 between the interpolated sample values 58 and estimated baud rate sample values 86. A slicer circuit 88 processes the interpolated sample values 58 to generate the estimated baud rate sample values 86. The phase error $\Delta\Theta$ 84 is then filtered by a loop filter 90 comprising a proportional path and an accumulation path, the output of which settles to a frequency offset $\Delta f$ 92 between the sampling clock 42 and the baud rate (i.e., it settles to the oversampling rate). The interpolation interval $\tau$ 80 is then generated at the output of a mod-Ts accumulator 94 which computes the modulo division of the accumulated oversampling rate $\Delta f$ 92 by the sampling period Ts. The mod-Ts accumulator 94 also generates a mask signal 96 for masking the sampling clock 42 through AND gate 98 to generate a data clock 64 at the rate of the interpolated data 58 (i.e., at the baud rate on average).

In practice, the mod-Ts accumulator 94 only retains the current interpolation interval $\tau$ which is added to the oversampling rate $\tau f$ 92 each time a new interpolated sample value 58 is generated. The integer portion of the sum is then used to determine the number of sample clocks to mask before generating the next interpolated sample. Consider, for example, an oversampling rate of $\Delta f$=3.2 and assume that the initial $\tau$ is zero (i.e., assume the first baud rate sample occurs at exactly 3.2 sample periods from the current signal sample). The following table illustrates the values for $\tau$ for each subsequent interpolated sample and the number of sample periods the sampling clock is masked between each interpolated sample value.

| Δf + τ$_k$ | τ$_{k+1}$ | # MASK periods |
|---|---|---|
| 3.2 + 0.0 | Frac(3.2) = 0.2 | Int(3.2) = 3 |
| 3.2 + 0.2 | Frac(3.4) = 0.4 | Int(3.4) = 3 |
| 3.2 + 0.4 | Frac(3.6) = 0.6 | Int(3.6) = 3 |
| 3.2 + 0.6 | Frac(3.8) = 0.8 | Int(3.8) = 3 |
| 3.2 + 0.8 | Frac(4.0) = 0.0 | Int(4.0) = 4 |
| 3.2 + 0.0 | Frac(3.2) = 0.2 | Int(3.2) = 3 |

The above table illustrates that the data clock 64 is substantially synchronized to the baud rate on average. The data clock 64 clocks the interpolator 66 to generate the interpolated samples 58 at the baud rate on average, and the data clock 64 also clocks operation of the Viterbi sequence detector 60 of FIG. 4.

The phase error detector 82 of FIG. 5 generate the phase error ΔΘ 84 by evaluating the interpolated samples 58 relative to ideal partial response signal samples. In the preferred embodiment, the ideal partial response signal samples of the RF read signal on either side of a zero crossing are equal in magnitude and opposite in sign. Therefore, the phase error can be computed by summing consecutive interpolated sample values 58 when a zero crossing is detected by the slicer 88, and then multiplying by the sign of the earlier interpolated sample value:

$$\Delta\theta = \frac{x_{k-1} + x_k}{2} \text{sgn}(x_{k-1})$$

where $x_{k-1} + x_k$ are the interpolated sample values 58. To achieve unit dc gain, the sum $(x_{k-1} + X_k)$ is divided by 2. To guarantee a stable loop gain, the phase error ΔΘ is multiplied by a constant proportional to the oversampling ratio. The slicer 88 is actually a zero crossing detector and the estimated sample values 86 simply indicate when a zero crossing is detected. The slicer 88 detects a zero crossing when two consecutive interpolated samples 58 are not equal to zero and have opposite signs, or if the earlier interpolated sample value $x_{k-1}$ is not zero and the current interpolated sample $x_k$ is zero.

At the end of a seek operation when the transducer arrives at the target track, the spindle motor may be rotating the disk in a range of 1 to 3 times the optimal angular velocity, therefore the baud rate will be in range of 1 to 3 times the optimal baud rate. Thus, the all digital timing recovery circuit 54 of FIG. 5 will lock onto the initial baud rate and then track the changing baud rate as the spindle motor is adjusted by the CLV servo loop.

Figure 6:
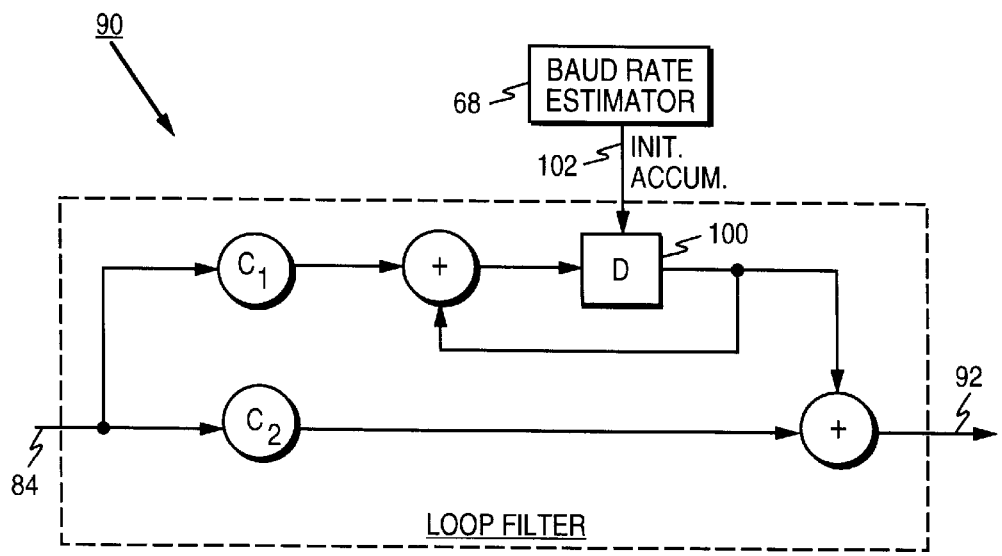
FIG. 6 shows details of the timing recovery loop filter of FIG. 5 which is initialized by the baud rate estimator.

In order for the digital timing recovery circuit of FIG. 5 to operate correctly, it is necessary to initialize the accumulator in the loop filter 90 relative to the initial oversampling rate at the end of the seek operation. The loop filter 90, as shown in FIG. 6, comprises an accumulation path and a proportional path with respective coefficients C1 and C2. The coefficients C1 and C2 control the frequency response of the timing loop and are adjusted according to whether the channel is acquiring the baud rate frequency or tracking the recorded data during a read operation. The delay register 100 in the accumulation path stores the current value for the average oversampling rate. This register 100 is initialized with an estimated oversampling rate 102 at the end of a seek operation. The estimated over sampling rate 102 is computed by a baud rate estimator 68.

Figure 8:
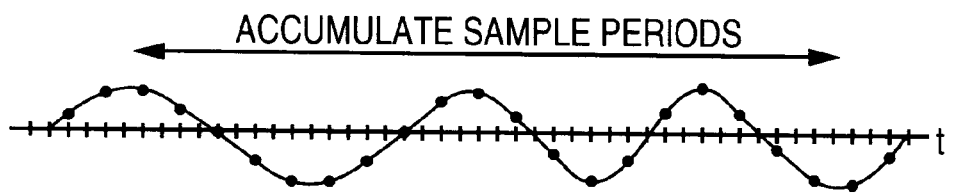
FIG. 8 illustrates operation of the baud rate estimator of the present invention.

The function of the baud rate estimator 68 is to estimate the initial baud rate relative to the sampling clock at the end of a seek operation. Statistically, a predetermined number of baud rate samples should occur in the RF read signal within a given number of zero crossings. For a CD-ROM storage device, for example, in 840 zero crossings there should be approximately 4096 baud rate samples. By counting the number of sampling periods that occur over a predetermined number of zero crossings as illustrated in FIG. 8, the baud rate can be estimated by dividing by the expected number of baud rate samples. By selecting the number of zero crossings such that the expected number of baud rate samples is a power of 2, then the division can be implemented using a simple shift register.

Figure 9:
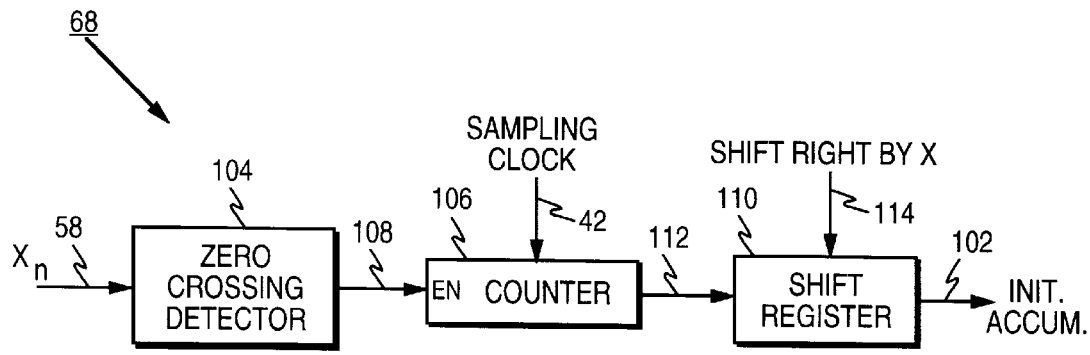
FIG. 9 shows details of the baud rate estimator of the present invention wherein the oversampling rate is estimated by dividing the number of channel samples accumulated over a predetermined number of zero crossings by the number of expected channel samples if the oversampling rate were unity.

Details of the baud rate estimator 68 are shown in FIG. 9. A zero crossing detector 104 which might be implemented similar to the slicer 88 of FIG. 5 as described above, enables a counter 106 over line 108 for a predetermined number of zero crossings detected from the interpolated sample values 58. While enabled, the counter 106 counts the number of sampling periods of the sampling clock 42 that occur. After detecting the desired number of zero crossings, the content of the counter 106 is loaded into a shift register 110 over line 112, and the content of the shift register is then shifted right by a predetermined value X 114 to divide the number of sample periods accumulated by the number of expected baud rate sample values. The result of the division is the estimated oversampling rate of the sampling device 38, that is, the number of channel samples per baud rate sample.

The following table illustrates a number of possible values for the number of expected sample values over a given number of zero crossings for both CD-ROM and DVD type storage devices.

| # of expected baud rate samples | # of zero crossings CD-ROM | # of zero crossings DVD |
|---|---|---|
| 1024 | 210 | 216 |
| 2048 | 420 | 432 |
| 4096 | 840 | 864 |

Selecting the larger values in the above table results in a baud rate estimate with less statistical variation. At the beginning of the baud rate estimation operation, the coefficients $C_1$ and $C_2$ in the timing loop filter 90 are initialized to zero, and the register 100 in the accumulation path is initialized to 1.

Figure 10:
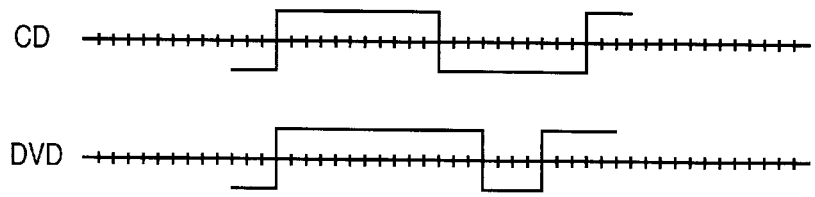
FIG. 10 shows the sync mark paterns for CD and DVD, respectively, relative to the baud rate sample instances.

An alternative embodiment of the baud rate estimator 68 is to count the number of channel samples 56 that occur in a sync mark, and then to divide by the expected samples in a sync mark if the oversampling rate were unity. In CD mode, a sync mark comprises 22 baud rate samples: 11 of one polarity followed by 11 of the opposite polarity as shown in FIG. 10. In DVD mode, a sync mark comprises 18 baud rate samples: 14 of one polarity followed by 4 of the opposite polarity as shown in FIG. 10. Therefore, the oversampling rate can be estimated by dividing the number of channel samples 56 (i.e., sampling clocks 42) that occur in a sync mark by the length of the sync mark in baud rate samples.

Since the baud rate length of the CD and DVD sync marks (22 and 18) are not a factor of 2, the division is more complex than a simple shift register as in the embodiment shown in FIG. 9. To simplify the embodiment, the oversampling rate is initialized to SYNC_LENGTH/16 and the number of interpolated samples 58 (i.e., data clocks 64) is counted instead of the number of channel samples 56 (i.e., sampling clocks 42). In this manner, the number of interpolated samples 58 counted in a sync mark can be divided by 16 to generate the estimated oversampling rate. Dividing by 16 can be implemented using a simple shift register as in FIG. 9.

Figure 11:
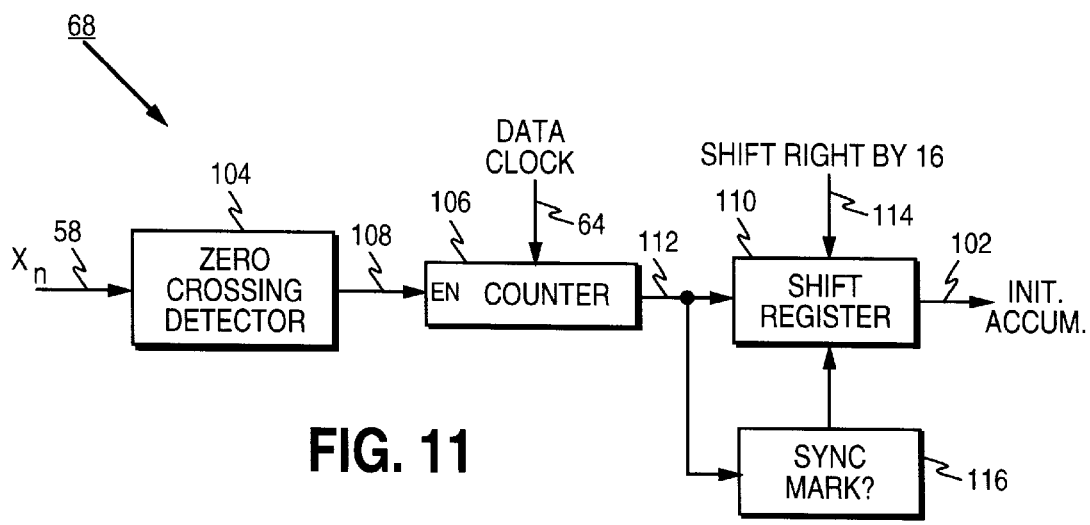
FIG. 11 shows an alternative embodiment of the baud rate estimator of the present invention wherein the oversampling rate is estimated by dividing the number of interpolated samples accumulated in a sync mark by the number of expected interpolated samples detected in a sync mark if the oversampling rate were unity.

The circuitry for implementing this version of the baud rate estimator 68 is shown in FIG. 11. At the beginning of the baud rate estimation operation, the coefficients $C_1$ and $C_2$ in the timing loop filter 90 are initialized to zero, and the register 100 in the accumulation path is initialized to SYNC_LENGTH/16 in order to initialize the oversampling rate to SYNC_LENGTH/16. Then depending on the maximum oversampling rate, a predetermined number of interpolated samples 58 are processed to search for a sync mark. The following table illustrates the number of interpolated samples 58 processed (block size) relative to the maximum oversampling rate for a given radial location on the disk:

|                  | Block Size |      |      |      |      |       |
|------------------|------|------|------|------|------|-------|
| Oversampling Rate | 3    | 3.5  | 4    | 5    | 6    | 8     |
| CD Block Size    | 1332 | 1554 | 1776 | 2220 | 2664 | 3552  |
| DVD Block Size   | 4020 | 4690 | 5360 | 6700 | 8040 | 10720 |

The circuitry in FIG. 11 operates similar to the circuitry of FIG. 9 except for the addition of a sync mark detector 116 which searches for the longest number of data clocks 64 accumulated by counter 106 over three consecutive zero crossings for CD, and for the longest number of data clocks 64 accumulated over two consecutive zero crossings for DVD. As the block is processed, the sync mark detector 116 evaluates the counter values 112 and loads the shift register 110 with the longest counter value 112 detected. At the end of the block, the accumulated number of data clocks 64 for the detected sync mark is divided by 16; a control signal 114 is applied the shift register 110 to shift the contents right by 16. The result of the division is the estimated oversampling rate 102 which is loaded into register 100 in the accumulation path of the timing loop filter 90. To reduce the probability of detecting an erroneous sync mark due to a defect on the disk, an estimated oversampling rate 102 is computed for three blocks, and the middle oversampling rate is used to initialize register 100.

Figure 1:
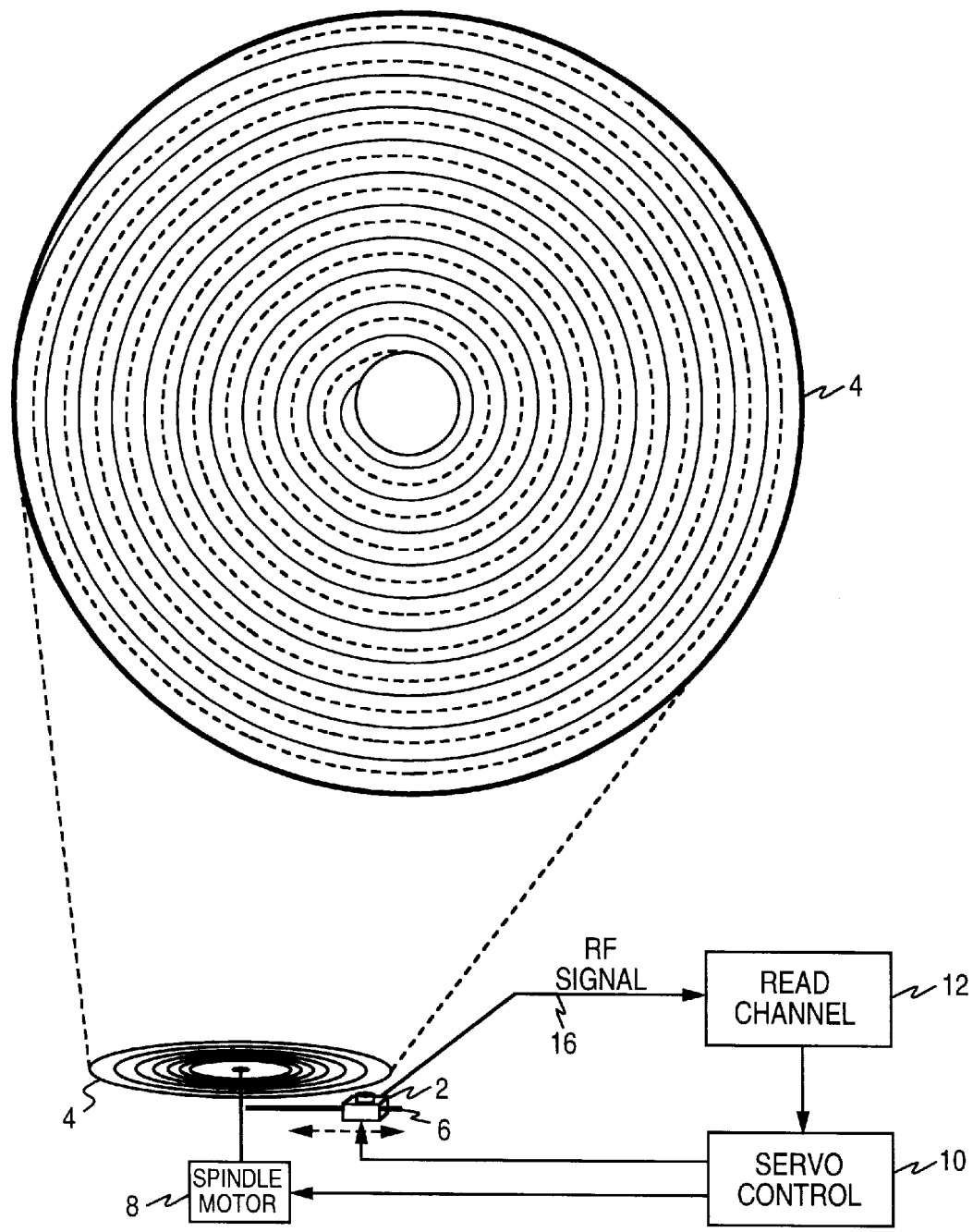
FIG. 1 shows an overview of a prior art optical disk storage device and format of the optical storage medium.
Figure 2:
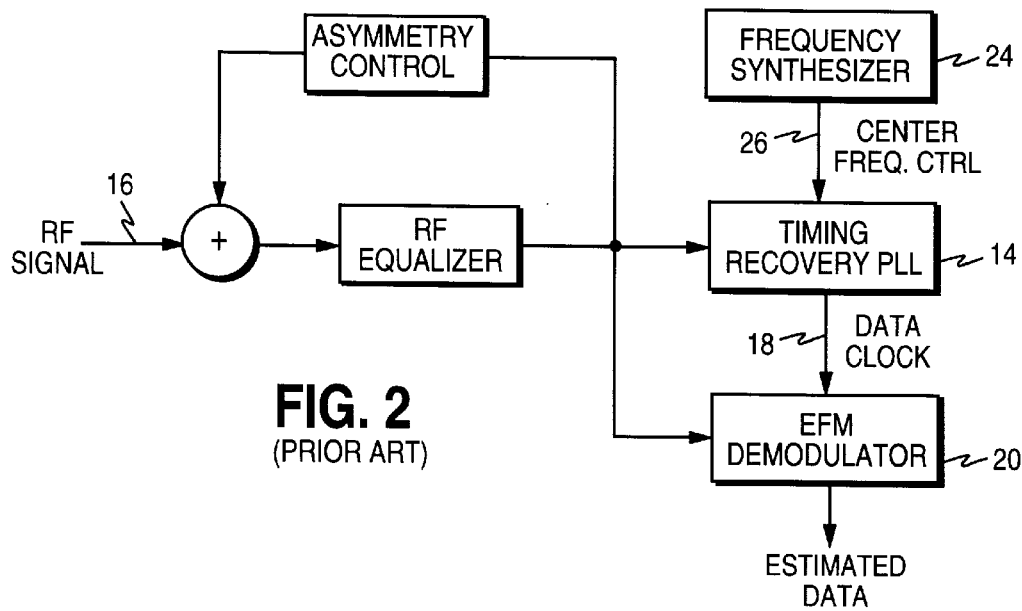
FIG. 2 is a block diagram of a prior art read channel employed in the optical disk storage device of FIG. 1.
Figure 3:
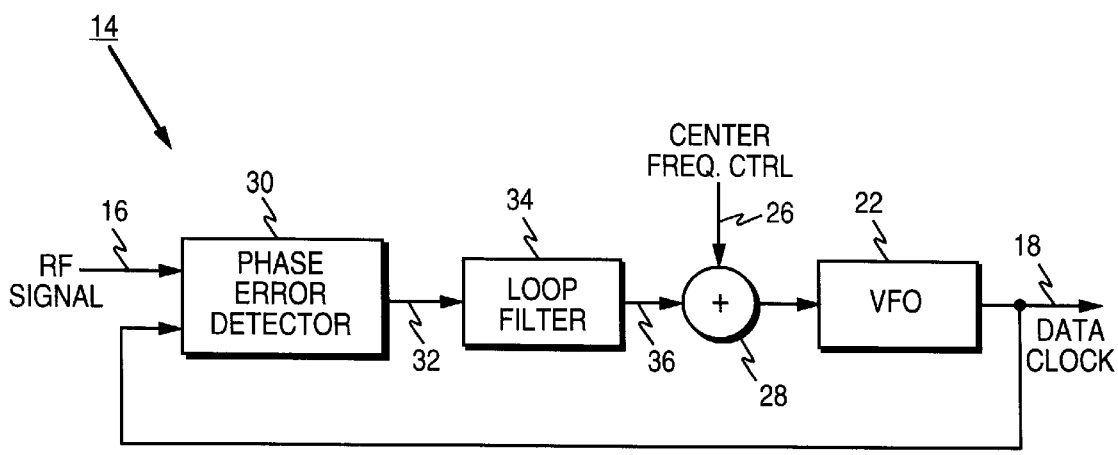
FIG. 3 shows details of the prior art timing recovery circuit comprising an analog phase locked loop (PLL) for generating a data clock synchronous to the baud rate.

The objects of the invention have been fully realized through the embodiments disclosed herein. Those skilled in the art will appreciate that the aspects of the invention can be achieved through various other embodiments without departing from the essential function. For example, the baud rate estimator could accumulate a fixed number of sampling periods while counting the number of zero crossings. The oversampling rate would then be computed by dividing an expected number of zero crossings by the number of accumulated zero crossings. The baud rate estimator could also be used to initialize a digital timing recovery loop employing a digital controlled oscillator (DCO). This alternative embodiment would comprise the circuitry of FIG. 5, but instead of interpolating 66, it would operate similar to the prior art PLL shown in FIG. 2 with the MOD-Ts accumulator 94 functioning as a DCO that is frequency and phase locked to the baud rate. The particular embodiments disclosed are illustrative and not meant to limit the scope of the invention as appropriately construed by the following claims.

We claim:

1. A sampled amplitude read channel for reading binary data recorded on an optical disk storage medium at a predetermined baud rate by detecting an estimated binary sequence from a sequence of sample values of an analog read signal emanating from an optical transducer positioned over the optical disk storage medium, the sampled amplitude read channel comprising:

(a) a sampling device for asynchronously sampling the analog read signal to generate a sequence of asynchronous sample values;

(b) digital timing recovery for extracting a data clock from the asynchronous sample values;

(c) a baud rate estimator for generating an estimated baud rate of the binary data in the analog read signal relative to a sampling period of the sampling device, the estimated baud rate for use in initializing the digital timing recovery; and (d) a data detector for detecting the estimated binary sequence.

2. The sampled amplitude read channel as recited in claim 1, wherein the baud rate estimator is configured to generate the estimated baud rate after a seek operation when the optical transducer reaches a target location over the optical disk.

3. The sampled amplitude read channel as recited in claim 2, wherein the baud rate estimator is configured to generate the estimated baud rate immediately after the seek operation and without waiting for the optical disk to reach a predetermined angular velocity.

4. The sampled amplitude read channel as recited in claim 2, wherein the baud rate estimator comprises:

(a) a zero crossing detector for detecting when the analog read signal crosses a zero threshold level;

(b) a counter for counting and storing a number of sampling periods of the sampling device over a predetermined number of zero crossings detected by the zero crossing detector; and (c) a quotient generator for generating a quotient by dividing the number of sampling periods stored in the counter by a predetermined number of expected sampling periods.

5. The sampled amplitude read channel as recited in claim 4, wherein the predetermined number of zero crossings counted is programmable.

6. The sampled amplitude read channel as recited in claim 4, wherein the predetermined number of zero crossings counted is programmably selected from the group consisting of 216, 432 and 864.

7. The sampled amplitude read channel as recited in claim 4, wherein the predetermined number of expected sampling periods is programmable.

8. The sampled amplitude read channel as recited in claim 4, wherein:

(a) the quotient generator comprises a shift register loaded with the number of sampling periods stored in the counter; and (b) the shift register is shifted to divide the number of sampling periods by a multiple of two.

9. The sampled amplitude read channel as recited in claim 1, wherein:

(a) the digital timing recovery comprises a loop filter;

(b) the loop filter comprises an accumulator; and (c) the accumulator is initialized using the estimated baud rate.

10. The sampled amplitude read channel as recited in claim 1, wherein the sampling device samples the analog read signal faster than the baud rate.

11. The sampled amplitude read channel as recited in claim 10, wherein the estimated baud rate approximates the number of sampling periods in a baud rate period.

12. The sampled amplitude read channel as recited in claim 11, wherein the baud rate estimator generates the estimated baud rate by dividing a detected number of channel samples in a sync mark by a predetermined denominator.

13. The sampled amplitude read channel as recited in claim 11, wherein the estimated baud rate comprises an integer number of sampling periods and a fractional sampling period.

14. The sampled amplitude read channel as recited in claim 1, wherein the data detector is a Viterbi sequence detector.

15. The sampled amplitude read channel as recited in claim 1, further comprising a discrete time equalizer for equalizing the asynchronous sample values according to a target spectrum.

16. A sampled amplitude read channel for reading binary data recorded on an optical disk storage medium at a predetermined baud rate by detecting an estimated binary sequence from a sequence of sample values of an analog read signal emanating from an optical transducer positioned over the optical disk storage medium, the sampled amplitude read channel comprising:

(a) a sampling device for asynchronously sampling the analog read signal to generate a sequence of asynchronous sample values;

(b) a discrete time equalizer for equalizing the asynchronous sample values according to a target spectrum;

(c) digital timing recovery for interpolating the asynchronous sample values to generate synchronous sample values substantially synchronized to the baud rate;

(d) a discrete time detector for detecting the estimated binary sequence from the synchronous sample values and (e) a baud rate estimator for generating an estimated baud rate of the binary data in the analog read signal relative to a sampling period of the sampling device, the estimated baud rate for use in initializing the digital timing recovery.

17. The sampled amplitude read channel as recited in claim 16, wherein the estimated binary sequence is detected immediately after a seek operation and without waiting for the optical disk to reach a predetermined angular velocity.

18. The sampled amplitude read channel as recited in claim 17, wherein the baud rate estimator comprises:

(a) a zero crossing detector for detecting when the analog read signal crosses a zero threshold level;

(b) a counter for counting a number of sampling periods of the sampling device over a predetermined number of zero crossings detected by the zero crossing detector; and (c) a quotient generator for generating a quotient by dividing the number of sampling periods stored in the counter by a predetermined number of expected sampling periods.

19. The sampled amplitude read channel as recited in claim 18, wherein the predetermined number of zero crossings counted is programmable.

20. The sampled amplitude read channel as recited in claim 18, wherein the predetermined number of expected sampling periods is programmable.

21. The sampled amplitude read channel as recited in claim 18, wherein:

(a) the quotient generator comprises a shift register loaded with the number of zero crossing stored in the counter; and (b) the shift register is shifted to divide the number of periods by a multiple of two.

22. The sampled amplitude read channel as recited in claim 16, wherein:

(a) the digital timing recovery comprises a loop filter;

(b) the loop filter comprises an accumulator; and (c) the accumulator is initialized using the estimated baud rate.

23. The sampled amplitude read channel as recited in claim 17, wherein the sampling devices samples the analog read signal faster than the baud rate.

24. The sampled amplitude read channel as recited in claim 23, wherein the estimated baud rate approximates the number of sampling periods in a baud rate period.

25. The sampled amplitude read channel as recited in claim 23, wherein the baud rate estimator generates the estimated baud rate by dividing a detected number of channel samples in a sync mark by a predetermined denominator.

26. The sampled amplitude read channel as recited in claim 24, wherein the estimated baud rate comprises an integer number of sampling periods and a fractional sampling period.

27. The sampled amplitude read channel as recited in claim 16, wherein the discrete time detector is a Viterbi sequence detector.

* * * * *